(12) United States Patent
Luk et al.

(10) Patent No.: US 6,768,692 B2
(45) Date of Patent: Jul. 27, 2004

(54) MULTIPLE SUBARRAY DRAM HAVING A SINGLE SHARED SENSE AMPLIFIER

(75) Inventors: Wing K. Luk, Chappaqua, NY (US); Toshiaki K. Kirihata, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 49 days.

(21) Appl. No.: 10/207,366

(22) Filed: Jul. 29, 2002

(65) Prior Publication Data

US 2004/0017691 A1 Jan. 29, 2004

(51) Int. Cl.[7] .............................................. G11C 7/00
(52) U.S. Cl. ............ 365/205; 365/230.03; 365/189.08; 365/207; 365/63
(58) Field of Search .................. 365/205, 230.03, 365/189.08, 207, 63

(56) References Cited

U.S. PATENT DOCUMENTS

| | | | | |
|---|---|---|---|---|
| 5,535,172 A | * | 7/1996 | Reddy et al. | 365/230.03 |
| 5,546,349 A | * | 8/1996 | Watanabe et al. | 365/230.04 |
| 5,610,871 A | * | 3/1997 | Hidaka | 365/230.03 |
| 5,625,602 A | * | 4/1997 | Hasegawa et al. | 365/222 |
| 5,774,408 A | | 6/1998 | Shirley | 365/230.03 |
| 5,828,594 A | * | 10/1998 | Fujii | 365/63 |
| 5,886,943 A | * | 3/1999 | Sekiguchi et al. | 365/230.03 |
| 5,889,329 A | | 3/1999 | Rostoker | 257/758 |
| 5,923,605 A | * | 7/1999 | Mueller et al. | 365/230.03 |
| 6,125,071 A | * | 9/2000 | Kohno et al. | 365/230.03 |
| 6,378,032 B1 | | 4/2002 | Robertson | 711/5 |
| 6,480,424 B1 | * | 11/2002 | Issa | 365/189.02 |
| 6,545,918 B2 | * | 4/2003 | Song | 365/189.11 |
| 6,552,944 B2 | | 4/2003 | Fifield | 368/208 |
| 6,633,952 B2 | * | 10/2003 | Winograd et al. | 711/106 |

OTHER PUBLICATIONS

"A 2.9ns Random Access Embedded DRAM with a Destructive-Read Architecture", C. Hwang et al, 2002 Symposium on VLSI Circuits, Digest of Technical Papers, Jun. 2002.

* cited by examiner

Primary Examiner—Viet Q. Nguyen
(74) Attorney, Agent, or Firm—George Sai-Halasz; Robert M. Trepp

(57) ABSTRACT

A method and system are disclosed for a DRAM having a single stage sensing architecture. In this architecture during a Read operation, in any datapath connecting a memory cell to a data I/O, there is one and only one sense amplifier. This sensing and latching scheme allows for the fast execution Read, Write, Write-back, and Refresh operation. Depending on the embodiment, Read and Write-back operations are executed in one, or two, cycles. Multiplexing of arrays and bit-linens results in efficient use of chip area.

18 Claims, 6 Drawing Sheets

Single stage sensing architecture

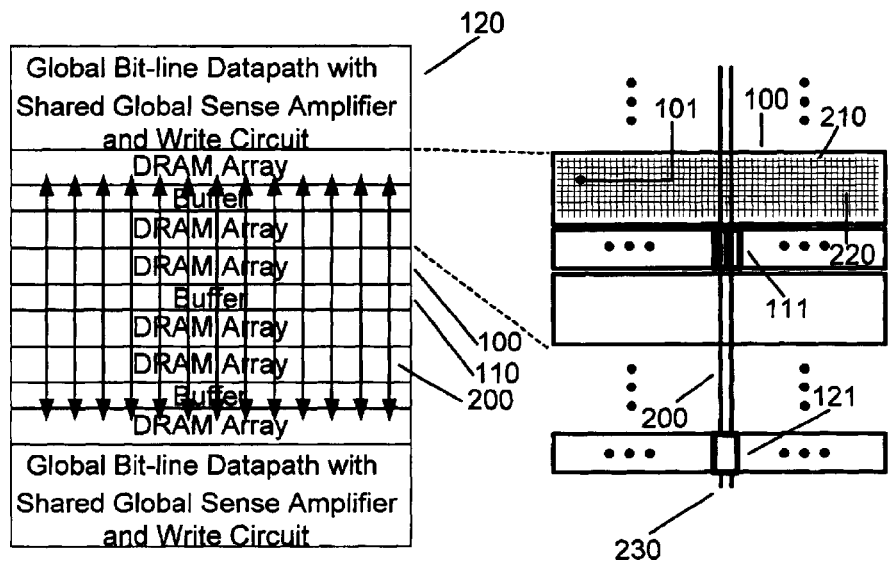
Fig. 2A
Fig. 2B
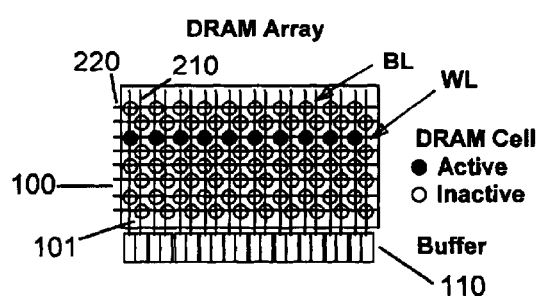
Fig. 2C

Multiple Bit-lines and Global Bitline Datapaths in an Embedded DRAM Array

MULTIPLE SUBARRAY DRAM HAVING A SINGLE SHARED SENSE AMPLIFIER

FIELD OF THE INVENTION

This invention relates to DRAMs having a new sensing architecture. In particular, the conventional two stage latching is reduced to a single, direct sensing by a global shared sense amplifier and latch. In this architecture a read datapath contains one and only one sense amplifier.

BACKGROUND OF THE INVENTION

Today's integrated circuits include a vast number of transistor devices formed in a semiconductor. Smaller devices are the key to enhance performance and to increase reliability. As devices are scaled down, however, the technology becomes more complex and new methods are needed to maintain the expected performance enhancement from one generation of devices to the next. In Dynamic Random Access Memories (DRAM) the improvement of the peripheral circuits is of importance. Today's high performance systems demand high speed memory access as well as wide memory bandwidth.

Conventional DRAM macros with multiple DRAM arrays consist of two separate stage of sense amplifiers and the corresponding latches, one at each DRAM array and one for the overall macro. The first stage of sense amplifiers/latches located at each DRAM array is used for sensing (reading) of the DRAM cell signals and the sensed data is stored in the latches. There are as many number of sense amplifiers and latches as the number of bit-lines, one sense amplifier/latch for each bit-line. Each of the first stage latches at each array are used for (1) during a Read operation, writing back to the DRAM cell after first stage sensing, and holding the sensed data and passing the data via its bit-switches, through the global bit-lines, onto the corresponding second stage sense amplifier, shared among all the arrays in the macro, for outputting to the corresponding dataline and I/O buffer external to the array, (2) during a Write operation, receiving and holding the data through its bit-switches from the global bit-lines, originated from the external I/O buffer and dataline, and writing to the DRAM cell. Usually, for the reading/writing of a bit of DRAM data, there requires two corresponding bit-lines, two bit-switches and two global bit-lines, configured to operate in differential, complementary mode.

In a conventional DRAM macro with primary sense amplifier and secondary sense amplifier each array is connected through the column bit-switches to the (differential) global bit-lines and then to the secondary sense amplifiers and the data I/O. There is a precharge circuit for each global bit-line.

Only one array and a word-line are active at a given time in a macro. The column bit-switch is used for multiplexing a number of bit-lines to a global bit-line, so that sharing of a global bit-line among the different arrays and among multiple bit-lines of an array can take place. Typically, in conventional DRAM, a global bit-line is shared among 8–64 bit-lines, e.g. 4K bit-lines with 512 global bit-lines, 2K primary sense amplifier, the multiplexing is 8:1. In the case of no sharing of global bit-line among bit-lines, i.e. one bit-line for each global bit-line, the column bit-switches are used for connecting the global bit-lines to the corresponding bit-lines in a particular array.

SUMMARY OF THE INVENTION

It is the object of this invention to describe a DRAM architecture which is simpler than the present art, it is of higher performance than the present art, and offers wide bandwidth data in and output rates.

This invention describes a DRAM architecture and sensing scheme for a DRAM macro with multiple arrays, without the use of the first stage sense amplifiers and latches as in a conventional DRAM. The primary sense amplifier and latch in a conventional DRAM can be totally eliminated for each differential pair of bit-lines. Instead of the conventional two stage sensing scheme, namely using primary sensing and latching, and secondary sensing and latching; a single stage, direct sensing scheme is introduced. In the new scheme, there is no primary sense amplifier and latch, DRAM signal is buffered at the array level to the global bit-line, and is sensed and latched directly at the macro level by the shared global sense amplifier which is shared among all the arrays in the DRAM macro. The term "sense amplifier" as used here, always includes latching as well. In the conventional approach, the DRAM signal has to go through two stages of sensing and sensing timing control (two separate steps to set sense amplifier latches), whereas in this scheme, the DRAM signal is sensed directly at the macro level by the shared global sense amplifier with only one stage of timing. For Write operation, the macro level shared sense amplifier and latch write to the DRAM cell directly, also without going through the two stages as in conventional approach where the primary sense amplifier and latch are involved. As a result, the control to read a DRAM data can be simplified with less margin of error and overall read access time and cycle time can be much reduced.

Buffers are located at each array to amplify the bit-line signals for the global bit-lines, and also isolate the bit-lines from the global bit-line loading and switching noises. In the buffer area, there are also the Read control devices to enable the buffers during a Read operation, and the Write control devices for enabling the writing path from global bit-lines to bit-lines during a Write operation. A buffer can be shared between two different bit-lines of two arrays by multiplexing. At the end(s) of the macro is the global sense amplifiers and latches shared among all the DRAM arrays for sensing, also is the write circuit for writing to the DRAM cells through the global bit-lines and bit-lines during the Writeback phase of a Read/Write-back operation, or during a Refresh operation, or during a Write operation.

The new scheme minimizes the global bit-line wire delay. Only one array and a word-line are active at a given time in a macro. There is no sharing of global bit-line among bit-lines, i.e. one bit-line for each global bit-line, the column bit-switches are used for connecting the global bit-lines to the corresponding bit-lines of a particular array. Each of the differential pair of bit-lines is connected to each of the corresponding pair of global bit-lines through a NFET device configured as a buffer (gate driven by bit-line and drain output to the global bit-line through a Read control NFET device) for Read operation. For Write operation, a global bit-line is connected to the corresponding bitline through a Write control device. Since there is no primary sense amplifier and latch, primary sensing data is not stored in the latch at the array, instead the DRAM signal, from one active bit-line and an adjacent inactive bit-line serving as reference signal, are amplified by the differential pair of buffers and in turn discharging the two corresponding precharged global bit-lines with two differential currents respectively. The two different currents, determined by the buffer gate voltage and passed through the source-drain of the two buffers, are developed on two different global bit-lines and create a differential voltage signal for the shared global sense amplifier at the other end. The differential voltage signal is sensed directly by the differential sense amplifier and stored at the global sense amplifier which also serving as a latch during a Read operation.

During a Write operation, data is written from the shared global sense amplifier through the global-bitlines to the bit-lines and then the individual DRAM cell.

The gate of the buffer NFET is controlled by voltage developed on the bit-line from the DRAM cell after the word-line is activated. Only one word-line is activated through out the macro. The NFET (drain to source) discharges the voltage on the global bit-line, which has been precharged to high ($V_{dd}$), slightly or heavily depending whether the DRAM cell stored a 0 or a 1. The gate voltage of the two different states (0 or 1), determines the drain-to-source current (Ids) through the NFET and hence the rate of discharging the global bit-line voltage. The other differential (inactive) bit-line is held at $V_{dd}/2$, assuming $V_{dd}/2$ sensing, which the bit-lines are precharged to $V_{dd}/2$. The differential signal on the two differential global bit-line is sensed by the shared, global differential sense amplifier at the other end of the DRAM macro, producing a corresponding logic 1 or 0 at the output.

For each Read operation, all the bits of the DRAM cells (N bits) controlled by the same word-line are read to the N shared global sense amplifiers. For Write-back operation, the N bits are written back to DRAM cells by the shared global sense amplifier. For each Write operation, N bits of data are written to the DRAM cells via the N global bit-lines. For Refresh operation, the N bits of data of a word-line are read to the shared global sense amplifiers and stored in the latches, and then written back to the corresponding DRAM cells by the same shared global sense amplifiers.

The single stage direct sensing scheme resulted in faster Read operation (smaller Read latency), since two separate "sense amplifier setting" control steps required for the two stages sensing increase the Read speed compared to this single stage sensing scheme. Further, the number of FET's used in the direct sensing is smaller than that required by the first stage of the two stage conventional sensing, hence resulted in smaller DRAM area.

BRIEF DESCRIPTION OF THE DRAWINGS

These and other features of the present invention will become apparent from the accompanying detailed description and drawings.

FIG. 2. Shows details of the single stage sensing architecture.

DETAILED DESCRIPTION OF THE INVENTION

Figure 1A:
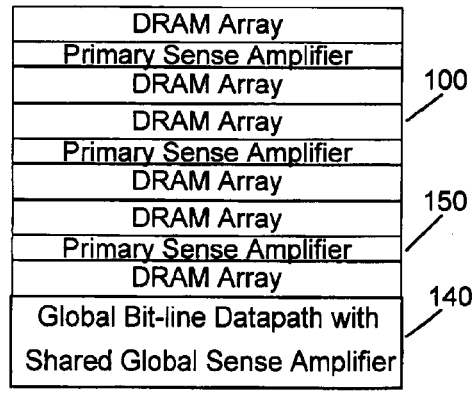
FIG. 1. Shows an overview of the prior art, and the single stage sensing architecture DRAMs.

FIG. 1 Shows an overview of the prior art, and the single stage sensing architecture DRAMs. On FIG. 1A a conventional DRAM macro with primary sense amplifiers and secondary sense amplifiers is shown. A plurality of memory cells are arranged into arrays 100. The first stage of sense amplifier-latches, located at each DRAM array, 150 are used for sensing (reading) of the DRAM cell signals and the sensed data is stored in the latches. These primary amplifier-latches 150 pass on signals through the global bit-lines, onto the corresponding second stage, shared global sense amplifiers 140, for outputting to the corresponding dataline and I/O buffer external to the array.

Figures 1B, 1C:
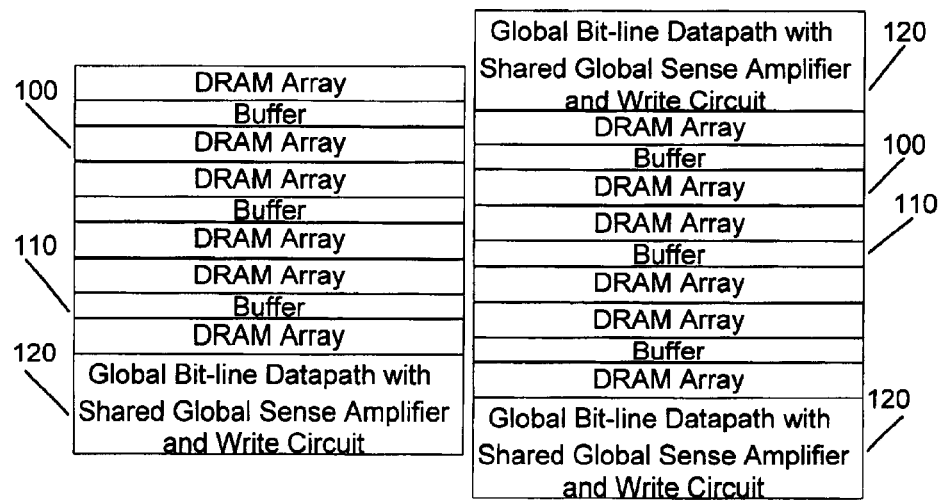

FIGS. 1B and 1C show arrangements of the single stage sensing architecture DRAMs. Buffers 110 are located at each array 100 to amplify the bit-line signals for the global bit-lines, and also to isolate the bit-lines from the global bit-line loading and switching noises. At the end(s) of the macro are the global sense amplifiers and latches 120, shared among all the DRAM arrays for sensing. Also, there are 120 the write circuits for writing to the DRAM cells through the global bit-lines and bit-lines during the Write-back phase of a Read/Write-back operation, or during a Refresh operation, or during a Write operation. FIG. 1B shows a DRAM macro with the buffers 110 at each array, and the shared global sense amplifiers and latches 120 at the end of the macro. FIG. 1C shows a DRAM macro with buffers 110 at each array, and two shared global sense amplifier banks 120 at each end of the macro. The two global sense amplifier bank structure is a variation to minimize the global bit-line wire delay, the top shared global sense amplifiers cover the sensing of the upper half of the arrays, and the bottom shared global sense amplifiers cover the sensing of the lower half of the arrays. Also FIG. 1B and FIG. 1C shows the buffers can be shared between two arrays through multiplexing (since only one array is active at a given time) to minimize area utilization. In an alternate embodiment, it is not necessary that a bank of buffers be shared among two arrays, in this case each array would have its own buffers without the use of multiplexing.

FIG. 2. Shows details of the single stage sensing architecture. FIG. 2A is similar to FIG. 1C with the global bit-line 200 structure shown. The global bit-lines 200 from the array area to the global sense amplifiers. FIG. 2B is an expanded/detailed view of a portion of FIG. 2A. It shows a buffer bank 110 with a cell array 100 on each side of it. In the array area there are individual memory cells 101, bit-lines 210 and word-lines 220. An individual buffers 111 are shown driving global bit-lines 200. A pair of global bit-lines 200 inputs into a global sense amplifier 121. The output of the global sense amplifier 121 goes to data I/O 230. FIG. 2C shows the array area 100 in more detail. Again, word-line 220, bit-line 210, and cell 101 are shown. A voltage on a word-line 220 can activate a row of cells. Bit-lines from the array lead directly to the buffers 110.

Figure 3:
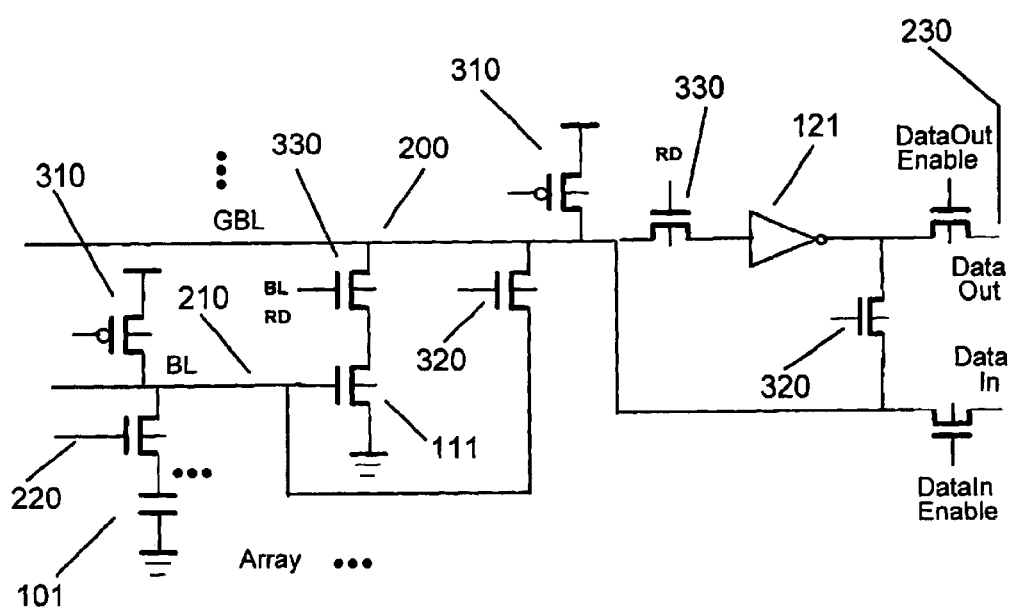
FIG. 3. Schematically shows circuits for DRAM arrays, buffers, and shared global sense amplifiers.

FIG. 3. Schematically shows circuits for DRAM arrays, buffers, and shared global sense amplifiers. This is a basic embodiment without multiplexing and a non-differential sense amplifier 121. Cell 101 is activated by word-line 220 and the charge from the cell reaches the buffer 111 through the bit-line 210. During read operation the buffer drives the global bit-line 200, which inputs into the global sense amplifier and latch 121. Write circuitry 320 bypasses the global sense amplifier and buffer to reach the cell with the data from the outside during Write operations. Precharge circuits 310 precharge the global 200 and local 210 bit-lines prior to Read operations. There are also the Read control devices 330 to enable the buffer and the global sense amplifier during a Read operation. The bit-line 210 the global bit-line 200 and the sense amplifier 121 together form the datapath, which connects a memory cell 101 to a data I/O 230.

Figure 4:
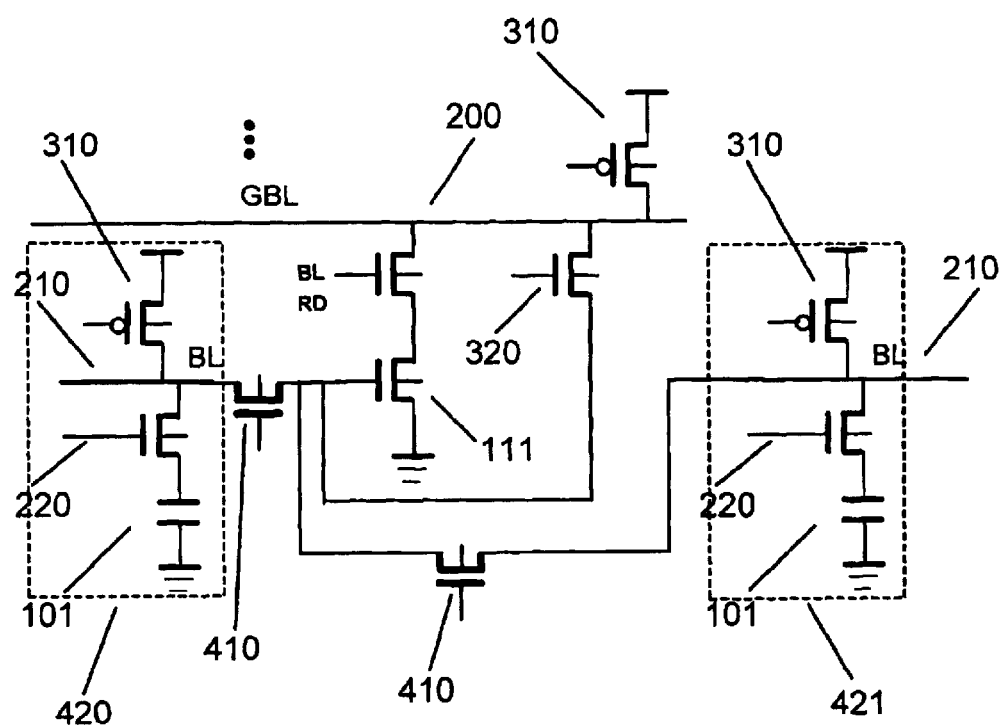
FIG. 4. Shows sharing of buffers between two arrays through multiplexing.

FIG. 4. Shows sharing of buffers between two arrays through multiplexing. Bit-lines 210 from two different arrays 420 and 421 bring signals of two different cells and a first multiplexing circuit 410 select which cell to become part of the datapath during a Read or Write operation.

Figure 5:
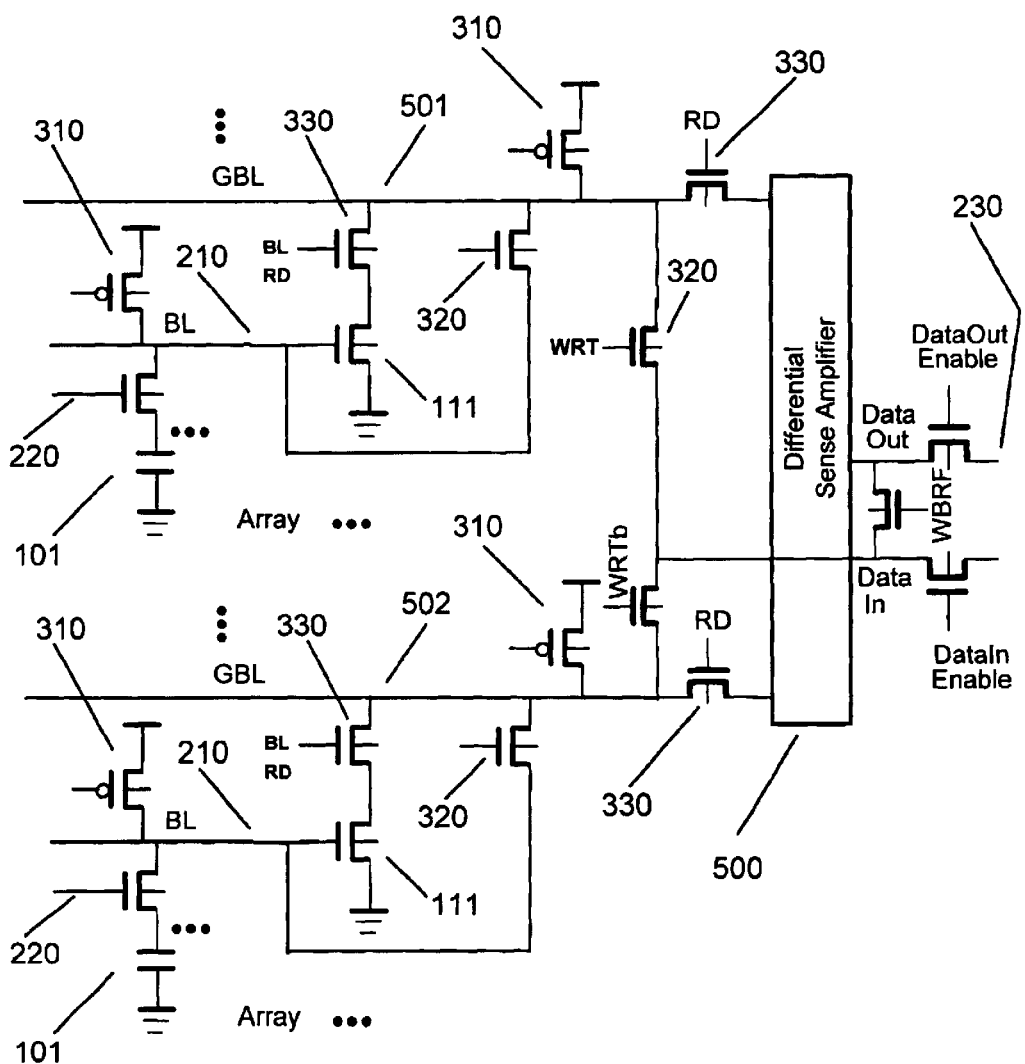
FIG. 5. Shows circuit schematic of a cross-section of a differential signal datapath from the DRAM cell to data I/O.

FIG. 5. Shows circuit schematic of a cross-section of a differential signal datapath from the DRAM cell to data I/O. The global sense amplifier 500 is a differential amplifier having two input ports in this embodiment. Two global bit-lines 501 and 502 are inputting to the global sense amplifier 500. One of the global bit-lies is active the other one a dummy bit-line. Which one is the active and which one is the dummy depends on what cell was activated by the word-line. The global bit-line belonging to the datapath of the activated cell is the active bit-line.

The gate of the buffer NFET 111 is controlled by a voltage developed on the bit-line 210 from the DRAM cell 101 after the word-line 220 is activated. Only one word-line is activated throughout the macro. The NFET (drain to source) discharges the voltage on the global bit-line 501 or 502, which has been precharged to high ($V_{dd}$), slightly or heavily depending whether the DRAM cell stored a 0 or a 1. The gate voltage of the two different states (0 or 1), determines the drain-to-source current (Ids) through the NFET 111 and hence the rate of discharging the global bit-line voltage. The other differential (inactive) bit-line 501 or 502 is held at $V_{dd}/2$, assuming $V_{dd}/2$ sensing, which the bit-lines are precharged to $V_{dd}/2$. The differential signal on the two differential global bit-line 501 and 502 is sensed by the shared, global differential sense amplifier 500 at the other end of the DRAM macro, producing a corresponding logic 1 or 0 at the output.

For a DRAM array with M word-lines and N bit-line pairs (2N bit-lines), each word-line activates N DRAM cells which are on alternating bit-lines. So when a word-line is activated, for each pair of bit-lines that are adjacent to each other, one bit-line is active with a DRAM cell being selected and the other one is inactive (DRAM cell not selected) with the bit-line voltage held at a precharged level. The inactive bit-line also reduces noise coupling between adjacent bit-lines since its voltage is held roughly unchanged. The predetermined voltage on the inactive bit-line serves as a reference point for differential sensing using two adjacent bit-lines, and in turn for the two adjacent global bit-lines and the two-input sense amplifier.

Figure 6:
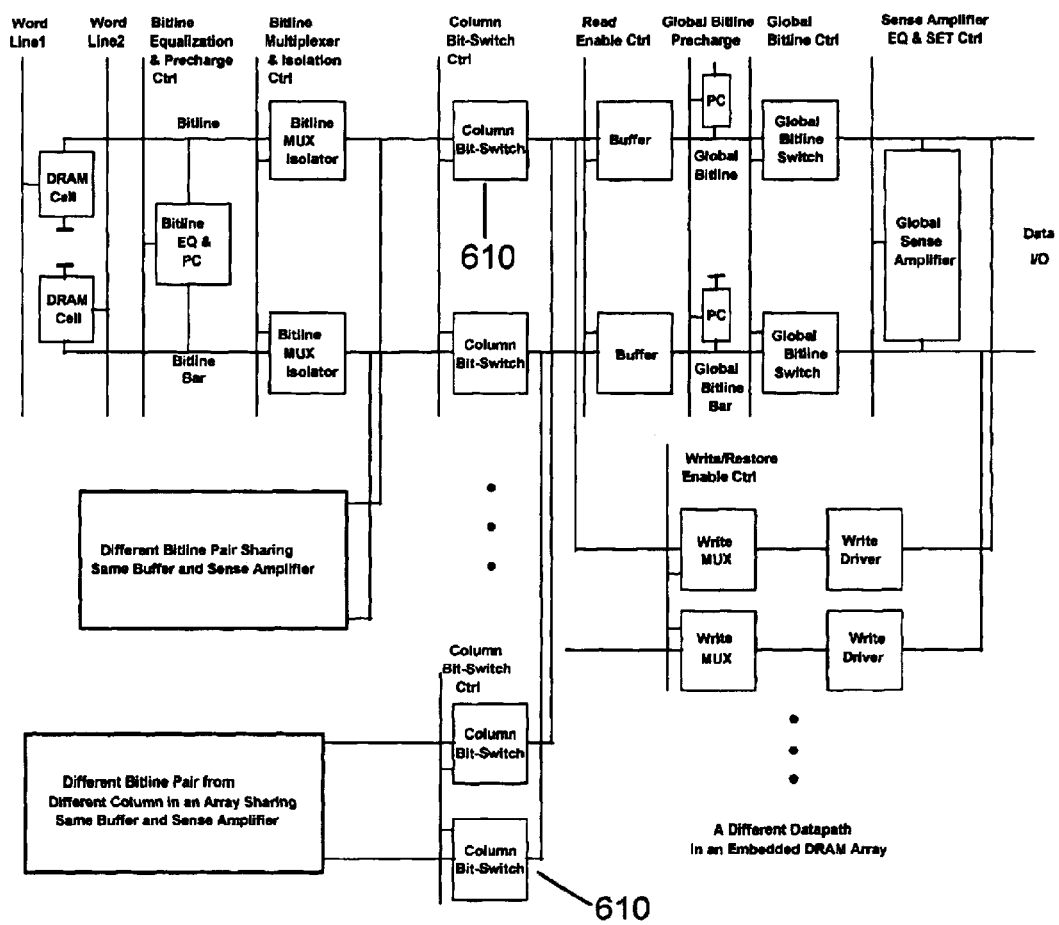
FIG. 6. Shows an organization of multiple bit-lines and global bit-line datapaths in an embedded DRAM array.

FIG. 6. Shows an organization of multiple bit-lines and global bit-line datapaths in an embedded DRAM array. It shows the detail structure, block diagram of a multiple array DRAM macro without primary sense amplifiers/latches, and a differential signal datapath to illustrate the read, write and refresh operation from DRAM cell to data I/O. It differs with the conventional DRAM in that, (1) the primary sense amplifiers/latches are missing, and the differential bit-line pair is connected directly to the buffers which amplify the signals for the global bit-lines, (2) the column bit-switches 610 are only for selecting the bit-lines among different arrays and can be combined with the array Read enable control and the array Write enable control, (3) data are written back from the global sense amplifiers through write paths and write enable multiplexers to the bit-lines, as detailed in FIGS. 3, 4, and 5. In each array, there are the DRAM cells and the control gates, the word-lines, the (differential) bit-lines, bit-line precharge and bit-line multiplexing circuits. Each bit-line of each array is connected to the gate of a buffer driving the corresponding global bit-line, the buffer is controlled by an array Read enable signal during a Read operation. The differential signal from the differential bit-line pair is amplified by the buffers resulting a differential drain-source current discharging on the corresponding precharged pair of global bit-lines. As a result, a different voltage appears at the input of the corresponding shared global sense amplifier, for it to sense it as a 0 or 1. During a Write operation, each write path of the global bit-line is connected to the corresponding bit-line via a multiplexer enabled by an array Write enable signal. There is a precharge circuit for each global bit-line. Only one array and a word-line are active at a given time in a macro. The column bit-switches are used for connecting the global bit-lines to the corresponding bit-lines of a particular array. In actual implementation, the column bit-switches are combined with the Read and Write enable circuits controlled by the array Read/Write control signals. Bit-line switches 610 are also the second multiplexing circuit, selecting between two possible bit-lines belonging to differing columns in a memory cell array.

In the single stage sensing architecture word-line access and bit-line sensing are done simultaneously by passing the developing bit-line signals to the global sense amplifier as soon as the word-line is activated without the explicit stage of setting primary sense amplifiers and closing of bit-line column switches, the control to read DRAM data can be simplified with less margin of error and overall read access time can be much reduced.

The Read and Write-back operations can be done in two cycles. First cycle is Read in which the data is read and stored in shared global sense amplifiers, the second cycle is Write-back to the DRAM cell. Also, the Refresh operation can be done in two cycles. In each cycle, the bit-lines and global bit-lines have to be precharged and the word-lines are turned ON and OFF. For each bit, the Read data is stored at the end of the first cycle in the global sense amplifier, and is written back to the DRAM cell in the second cycle. In the two cycle operation, the cycle time is minimized.

The Read and Write-back operations can also be combined into a single cycle as practiced in conventional DRAM. After the data are sensed and latched into the shared global sense amplifiers, the Read bit-switches are turned OFF to separate global sense amplifiers from the global bit-lines. Then the Write bit-switches are turned ON so the global sense amplifiers can write the data back to the DRAM cells via the global bit-lines. These operations are done in the same cycle while the word-lines are ON.

In one embodiment the speed of the DRAM is also helped by the fact that the word-line activation, sensing, and transferring the signals to the data output are operated in a self-timed fashion.

Many modifications and variations of the present invention are possible in light of the above teachings, and could be apparent for those skilled in the art. The scope of the invention is defined by the appended claims.

We claim:

1. A DRAM having a single stage sensing architecture, comprising:
a plurality of memory cells, said cells arranged in memory cell arrays;
a plurality of datapaths, each of said datapaths connecting one of said memory cells to a data I/O during a Read operation; and
a plurality of sense amplifiers, wherein any one of said datapaths comprises one and only one of said sense amplifiers.

2. The DRAM of claim 1, further comprising:
a plurality of bit-lines; and
a plurality of global bit-lines, wherein said any one of said datapaths further comprises one of said bit-lines and one of said global bit-lines, and wherein in said any one of said datapaths: said one of said global bit-lines being driven by a buffer, said buffer receiving input from said one of said bit-lines, and said one and only one of said sense amplifiers receiving input from said one of said global bit-lines.

3. The DRAM of claim 2, further comprising first multiplexing circuits, wherein each of said first multiplexing circuit adapted to select said one of said bit-lines, wherein said one of said bit-lines is selected out of two possible bit-lines, wherein each of said two possible bit-lines belongs to differing ones of said memory cell arrays.

4. The DRAM of claim 2, further comprising second multiplexing circuits, wherein each of said second multiplexing circuit adapted to select said one of said bit-lines, wherein said one of said bit-lines is selected out of two possible bit-lines, wherein each of said two possible bit-lines belongs to differing columns of one of said memory cell arrays.

5. The DRAM of claim 2, wherein said one and only one of said sense amplifiers is a differential amplifier, said differential amplifier receiving a second input from a dummy global bit-line.

6. The DRAM of claim 2, further comprising:
write-circuitry, wherein said write-circuitry connecting said data I/O and said one of said memory cells during a Write operation, and wherein said write-circuitry bypassing said one and only one of said sense amplifiers and said buffer.

7. The DRAM of claim 6, further comprising:
pre-charge-circuitry, wherein said pre-charge-circuitry pre-charges prior to said Read operation those of said plurality of bit-lines and those of said plurality of global bit-lines that will be part of said plurality of datapaths during said Read operation.

8. A method for single stage sensing in a DRAM, comprising the step of:
using one and only one sense amplifier in a datapath, wherein said datapath is any one of a plurality of datapaths, said datapaths connecting memory cells to data I/O-s during a Read operation 9. The method of claim 8, further comprising the steps of:
providing a plurality of bit-lines;
providing a plurality of global bit-lines; and
in said datapath driving one of said global bit-lines through a buffer with one of said bit-lines, and inputting said one of said global bit-lines into said one and only one sense amplifier.

10. The method of claim 9, further comprising the steps of:
providing a plurality of memory cell arrays; and
selecting with a first multiplexing circuit said one of said bit-lines, wherein said one of said bit-lines is selected out of two possible bit-lines, wherein each of said two possible bit-lines belonging to differing ones of said memory cell arrays.

11. The method of claim 9, further comprising the steps of:
providing a plurality of memory cell arrays; and
selecting with a second multiplexing circuit said one of said bit-lines, wherein said one of said bit-lines is selected out of two possible bit-lines, wherein each of said two possible bit-lines belonging to differing columns of one of said memory cell arrays.

12. The method of claim 9, further comprising the step of using a differential amplifier having a second input port for said one and only one sense amplifier, and inputting a dummy global bit-line into said second input port of said differential amplifier.

13. The method of claim 9, further comprising the step of:
providing write-circuitry, wherein said write-circuitry connecting said data I/O-s with said memory cells during a Write operation, and wherein said write-circuitry bypassing said one and only one sense amplifier and said buffer.

14. The DRAM of claim 13, further comprising the step of:
providing pre-charge-circuitry, wherein said pre-charge-circuitry prior to said Read operation is pre-charging those of said plurality of bit-lines and those of said plurality of global bit-lines that will be part of said plurality of datapaths during said Read operation.

15. The method of claim 8, further comprising the step of executing simultaneously a word-line access and a bit-line sensing.

16. The method of claim 8, further comprising the step of:
executing a Read operation; and
executing a Write operation in a same time cycle as executing said Read operation.

17. The method of claim 8, further comprising the step of:
executing a Read operation; and
executing a Write operation in a different time cycle than executing said Read operation.

18. The method of claim 8, further comprising the step of self-timing an operation sequence, wherein said sequence comprises a word-line activation, said one and only one sense amplifier sensing, and said one and only one sense amplifier outputting to said I/O.

* * * * *